United States Patent [19]
Lee et al.

[11] Patent Number: 6,136,695
[45] Date of Patent: Oct. 24, 2000

[54] METHOD FOR FABRICATING A SELF-ALIGNED CONTACT

[75] Inventors: Yu-Hua Lee, Hsinchu; Cheng-Ming Wu, Kao-Hsiung; Ming-Hsiung Chiang, Taipei, all of Taiwan

[73] Assignee: Taiwan Semiconductor Manufacturing Company, Hsin-Chu, Taiwan

[21] Appl. No.: 09/366,741

[22] Filed: Aug. 4, 1999

[51] Int. Cl.$^7$ ................................................ H01L 21/4763
[52] U.S. Cl. ........................ 438/637; 438/638; 438/639; 438/640
[58] Field of Search .................... 438/637, 638, 438/639, 640

[56] References Cited

U.S. PATENT DOCUMENTS

| | | | |
|---|---|---|---|
| 5,262,352 | 11/1993 | Wao et al. | 437/189 |
| 5,466,637 | 11/1995 | Kim | 437/187 |
| 5,547,893 | 8/1996 | Sung | 437/52 |
| 5,565,372 | 10/1996 | Kim | 437/52 |
| 5,795,827 | 8/1998 | Liaw et al. | 438/663 |
| 5,882,535 | 3/1999 | Stocks et al. | 216/18 |
| 6,010,953 | 1/2000 | Prall | 438/586 |
| 6,020,236 | 2/2000 | Lee et al. | 438/253 |
| 6,033,980 | 3/2000 | Liou et al. | 438/624 |

*Primary Examiner*—Jey Tsai
*Assistant Examiner*—Jennifer M. Kennedy
*Attorney, Agent, or Firm*—George O. Saile; Stephen B. Ackerman; William J. Stoffel

[57] ABSTRACT

A method for forming a self aligned contact wherein a dielectric layer is formed directly on a conductive structure according to the present invention. A semiconductor structure having a polysilicon conductive structure (such as a bit line) thereon is provided. A contact area is located on the semiconductor structure adjacent to the conductive structure. A dielectric layer, preferably composed of silicon oxide is formed over the conductive structure and the semiconductor structure. A top hard mask layer is formed over the dielectric layer. A contact opening is formed in the top hard mask layer and the dielectric layer using an etch selective to oxide over polysilicon, thereby exposing the contact region of the semiconductor structure adjacent to the conductive structure without etching through the conductive structure. A first lining dielectric layer, a second lining dielectric layer, and a third lining dielectric layer are sequentially deposited on the sidewalls of the contact opening and on the contact area of the semiconductor structure. The first and third lining dielectric layers are preferably composed of silicon dioxide and the third lining dielectric layer is preferably composed of silicon nitride. The third lining dielectric layer is anisotropically etched forming a second contact opening in the second lining dielectric layer over the contact area while leaving a spacer on the sidewall of the contact opening. The second lining dielectric layer and the first lining dielectric layer are anisotropically etched to expose the contact area of the semiconductor structure, while the spacer prevents erosion of the second lining dielectric layer and the first lining dielectric layer on the sidewall of the contact opening. The remaining spacer is removed, preferably using a buffered HF dip. A polysilicon contact layer is formed on the second lining dielectric layer and on the contact area of the semiconductor structure.

14 Claims, 4 Drawing Sheets

METHOD FOR FABRICATING A SELF-ALIGNED CONTACT

BACKGROUND OF INVENTION

1) Field of the Invention

This invention relates generally to fabrication of semiconductor devices and more particularly to a process for forming a self-aligned polysilicon contact, with a reduced aspect ratio contact opening, reduced chance of keyhole problems, and reduced chance of contact to bit line shorting.

2) Description of the Prior Art

The use of self aligned contact (SAC) processes has resulted in higher performance, lower cost, and increased density in semiconductor devices. If a self-aligned contact process, spacers are formed on the sidewalls of conductive structures (such as gates or bit lines). A dielectric layer is formed over these conductive structures. A contact opening is etched through the dielectric layer. A conductive layer, such as for capacitor crowns, is formed over the conductive structures and in the contact opening. However, as device dimensions and die sizes continue to decrease for higher density, the gap between adjacent conductive structures becomes narrower. Sidewall spacers make the gap even narrow, resulting in a high aspect ratio for photolithography which reduces accuracy.

Another problem is caused by an overhang of the dielectric layer. As the gap width decreases the overhang of the dielectric layer can close the gap at the top before the gap is completely filled resulting in a void (or key hole) in the dielectric layer. The key hole can fill with conductive material during subsequent formation of a conductive contact layer causing two separate devices (such as capacitors) which are formed over the dielectric layer to short. The short can result in cell failure.

Yet another problem which can occur in a self aligned contact process is silicon nitride etch through. The dielectric layer must be completely removed from above the contact plug in order to achieve a low contact resistance. Over-etching can cause etch through of the hard mask and/or the sidewall spacer and an electrical short between the conductive structure and the adjacent self aligned contact.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,565,372 (Kim) shows a SAC process comprising: forming a blanket dielectric layer, a conductive layer, and another dielectric layer over a gate with a hard mask; etching through the dielectric layer and conductive layer to form a contact opening; and forming a dielectric spacer on the sidewalls of the contact opening.

U.S. Pat. No. 5,547,893 (Sung) shows an oxide spacer if a self-aligned bit line contact.

U.S. Pat. No. 5,252,352 (Woo et al.) shows spacers on contact holes.

U.S. Pat. No. 5,795,827 (Liaw et al.) shows a SAC.

SUMMARY OF THE INVENTION

It is an object of the present invention to provide a method for fabricating a self aligned contact having a reduced depth (aspect ratio).

It is another object of the present invention to provide a method for forming a self-aligned contact with reduced susceptibility to the keyhole problem.

It is another object of the present invention to provide a method for forming a self aligned contact with reduced susceptibility to contact a bit line shorting.

It is another object of the present invention to provide a method for forming a capacitor over raised bit lines.

It is yet another object of the present invention to provide an economical and robust method for forming a self aligned contact.

To accomplish the above objectives, the present invention provides a method for forming a self-aligned contact wherein a dielectric layer is formed directly on a conductive structure according the present invention. The process begins by providing a semiconductor structure having a polysilicon conductive structure (such as a bit line) thereon. A conductive area is located on the semiconductor structure adjacent to the conductive structure and the semiconductor structure. A top hard mask layer is formed over the dielectric layer. A contact opening is formed in the top hard mask layer and the dielectric layer using an etch selective to oxide over polysilicon, thereby exposing the conductive area of the semiconductor structure adjacent to the conductive structure without etching through the conductive structure. A first lining dielectric layer is deposited on the sidewalls of the contact opening and on the contact area of the semiconductor structure. A second lining dielectric layer is formed over the first lining dielectric layer. A third lining dielectric layer is formed over the second lining layer. The first lining dielectric layer and the third lining dielectric layer are composed of a material having poor step coverage such as PECVD silicon oxide. The second lining dielectric layer is composed of a material having good etch selectively with respect to the first and third lining dielectric layers, such as silicon nitride. The third lining dielectric layer is anisotropically etched forming a second contact opening in the third lining dielectric layer over the contact area while leaving a spacer on the sidewall of the contact opening. The second lining dielectric layer and the first lining dielectric layer are anisotropically etched to expose the conductive area of the semiconductor structure, while the spacer prevents erosion of the second lining dielectric layer and the first lining dielectric layer on the sidewall of the contact opening. The remaining spacer is removed using a selective etch such as buffered HF dip for an oxide spacer. A polysilicon contact layer is formed on the second lining dielectric layer and on the contact area of the semiconductor structure.

The present invention provides considerable improvement over the prior art. The process of the present invention provides a reduced aspect ratio, a reduced key hole problem, and a reduced etch through problem. The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for forming a self-aligned contact without key holes in the inter poly oxide layer using a two step contact layer deposition.

SAC Process Known by the Inventors to Have Problems

FIGS. 1A through 1D, show a process known by the invention to have three problems. (1) The conductive structure and hard mask with sidewall spacers cause a high aspect ratio making precise photolithography difficult. (2) poor gap filling in the narrow gap between adjacent conductive structures can cause a void (or key hole) in the inter poly oxide layer. (3) Over etching during contact opening etch can cause etch through of the silicon nitride hard mask or silicon nitride sidewall spacers resulting in contact to conductive structure shorting.

Figure 1A:
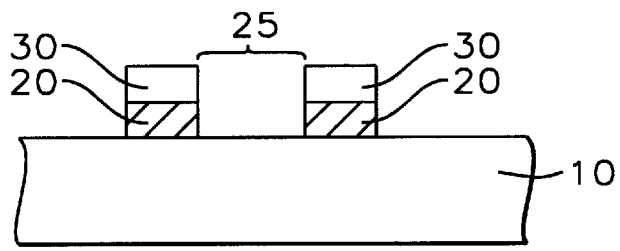
FIGS. 1A, 1B, 1C & 1D show sequential sectional views of a self aligned contact formed according to a process which the inventors have found to have problems.

Referring to FIG. 1A, the process begins by providing a semiconductor structure (10) for a semiconductor device, such as for a DRAM device. Semiconductor structure is understood to include a substrate and possibly to include active and passive devices formed within the wafer and conductive and/or insulating layer formed over the substrate.

The semiconductor structure (10) has a conductive structure (20) thereon. A conductive area (25) is located on the surface of the semiconductor structure (10) adjacent to the conductive structure (20). The conductive structure (20) is preferably a line (such as a bit line or word line) comprised of polysilicon and preferably has an underlying dielectric layer (not shown). In the problem process, a hard mask (30) is located on the top of the conductive structure (20). The hard mask (30) is preferably composed of silicon nitride. The conductive structure (20) and hard mask (30) have sidewalls and a top.

Figure 1B:
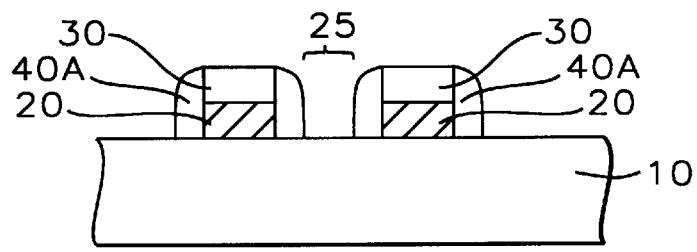

Referring to FIG. 1B, in the problem process, a sidewall spacer layer (not shown) is formed over the hard mask and the substrate (10). The sidewall spacer layer (not shown) is preferably composed of silicon nitride using plasma enhanced chemical vapor deposition (PECVD). The sidewall spacer layer (40) is anisotropically etched to form sidewall spacers (40A).

Figure 1C:
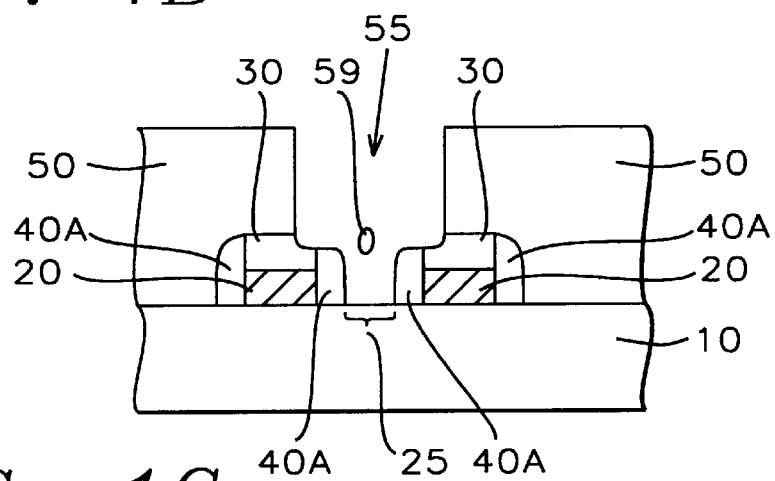

Referring to FIG. 1C, an inter poly oxide layer (50) (IPO) is formed over the sidewall spacers (40A), the conductive structure (20), and the semiconductor structure (10) using plasma enhanced chemical vapor deposition (PECVD). A self aligned contact opening (55) is formed in the inter poly oxide layer (50). The self aligned contact opening (55) is formed by photolithography and anisotropic etch. When the gap width between adjacent conductive structures is small, further narrowing by the sidewall spacers and the combined height of the conductive structure and the hard mask can result in a high aspect ratio (height to width) causing reduced precision in the photolithography and etch processes.

Also as shown in FIG. 1C, the narrow gap between the sidewall spacers (40A) can cause a void (or key hole) (59) in the IPO layer (50). This void (59) is shown in the back side of the IPO layer (50) in the contact opening (55). PECVD oxide has poor gap filling properties causing it to overhang (become concave) on vertical surfaces. When the gap between adjacent conductive structures is narrow, the overhang can close the gap at the top before the gap is completely filled forming a void (59) in the IPO layer (50).

Figure 1D:
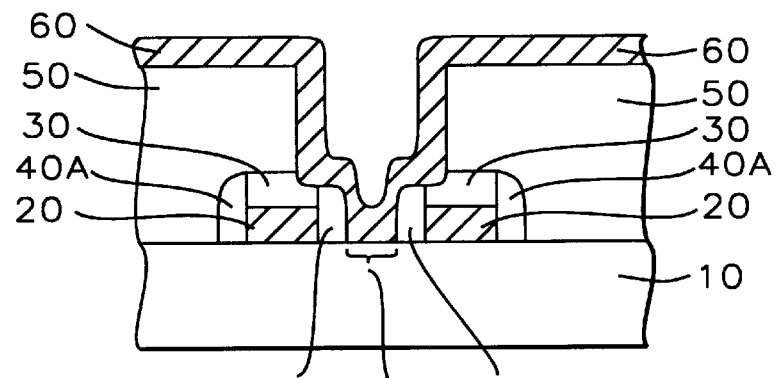

Referring to FIG. 1D, a contact layer (60) is formed on the conductive area (25) of the semiconductor structure (10), the sidewall spacers (40A), and the sidewalls of the contract opening (55). The contact layer (60) is composed of a conductive material, preferably polysilicon. The polysilicon can fill the key hole (59) causing a short between adjacent contact holes (55).

Another key disadvantage of the problem process is that silicon nitride etch through can cause a conductive structure (20) to contact layer (60) short. The IPO oxide must be completely removed from above the contact area (25) in order to achieve a low contact resistance. Over-etching can cause etch through of the hard mask (30) and/or the sidewall spacer (40A) and an electrical short between the conductive structure and the adjacent self aligned contract. However, as discussed above, increasing the thickness of the hard mask (30) and the sidewall spacers (40A) can increase aspect ratio and key hole problems.

Preferred Embodiment

FIGS. 2A through 2F, show a process for forming a self-aligned contact wherein the IPO layer is formed directly on a conductive structure according the present invention. The process of the present invention provides a reduced aspect ratio, a reduced key hole problem, and a reduced etch through problem.

In the preferred embodiment of the present invention, the process begins by providing a semiconductor structure (10), such as for a DRAM. As with the problem process, semiconductor structure is understood to include a substrate and possibly to include active and passive devices formed within the wafer and conductive and/or insulating layers formed over the substrate.

Figure 2A:
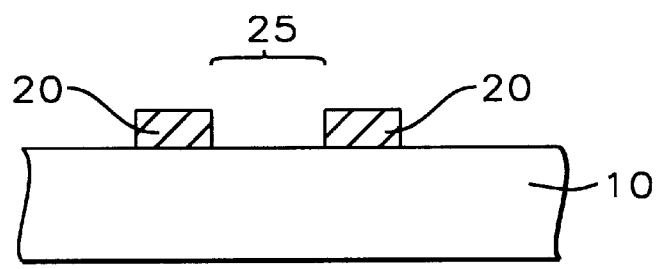
FIGS. 2A, 2B, 2C, 2D, 2E & 2F illustrate sequential sectional views of a current process for fabrication of a self-aligned contact according to the present invention.

Referring to FIG. 2A, the semiconductor structure (10) has a conductive structure (20) thereon. A contact area (25) is located on the surface of the semiconductor structure (10) adjacent to the conductive structure (20). The conductive structure (20) is composed of polysilicon and has a thickness of between about 1000 Angstroms and 3000 Angstroms, a width of between about 0.15 microns and 0.30 microns, and is separated from an adjacent conductive structure by a gap of between about 0.15 microns and 0.3 microns.

Figure 2B:
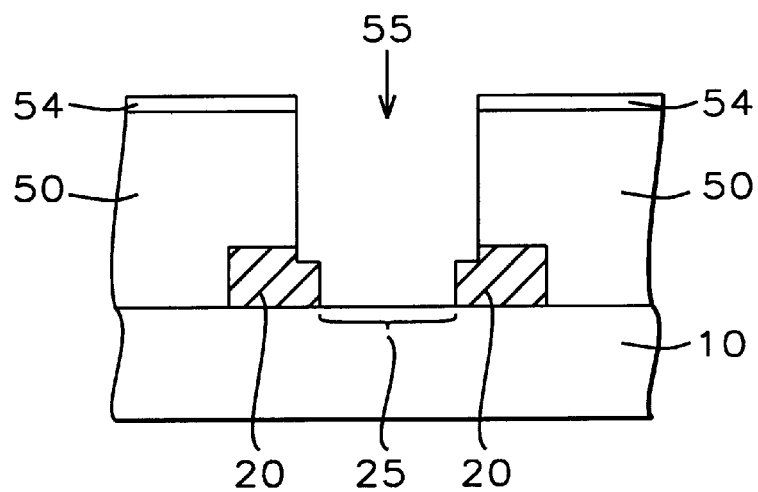

Referring to FIG. 2B, a dielectric layer (50) comprising silicon oxide, such as an inter poly oxide layer, is formed directly on the semiconductor structure (10) and the conductive structure (20). A top hard mask layer (54) is formed on the dielectric layer (50) having a thickness of between about 100 Angstroms and 300 Angstroms. The top hard mask layer (54) can be comprised of silicon nitride (SiN) or most preferably silicon oxynitride (SiON).

A key advantage of the present invention is that the aspect ratio is reduced. Because the dielectric layer (50) is formed directly on the conductive structure (20), the aspect ratio is smaller than in the problem process where the gap is further narrowed by sidewall spacers and the height is increased by a hard mask overlying the conductive structure. The reduced aspect ratio improves photolighography and etch process precision.

Still referring to FIG. 2B, a self-aligned contact opening (55) having sidewalls is formed in the top hard mask layer (54) and the dielectric layer (50) over the contact area (25)

using photolithography and an anisotropic etch selective to oxide ver polysilicon such as a CHF$_3$/CHF$_4$ chemistry.

The dielectric layer (50) is completely removed over the contact area (25), but, due to the etch selectivity, the polysilicon conductive structure (20) is only partially removed at its edges which are exposed to the etch.

Another key advantage of the present invention is that the key hole problem is reduced. In the problem process where the sidewall spacers and hard mask cause the gap to be narrower and deeper then in the present invention, the overhang of the dielectric layer oxide can close the gap at the top before it is completely filled. Because the dielectric layer (50) is formed directly on the conductive structure (20), overhang of the dielectric oxide is less likely to close the gap at the top before the gap is completely filled. Thus, the key hole problem which can cause shorting and cell failure is reduced.

Figure 2C:
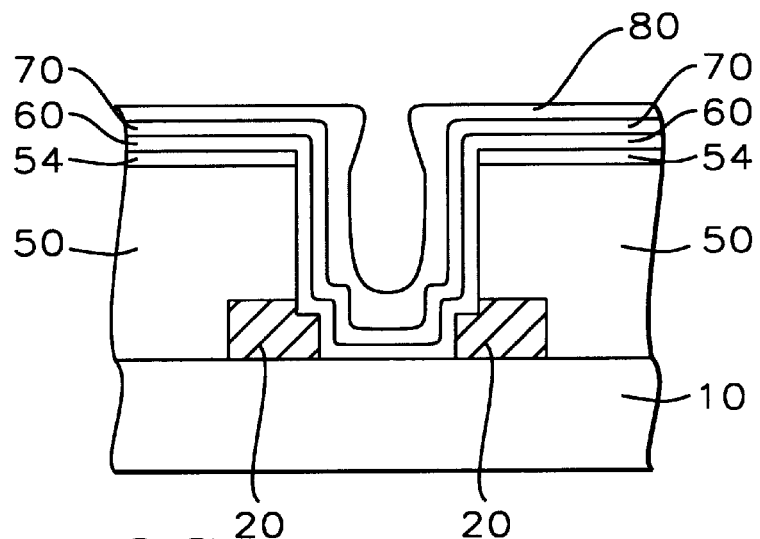

Referring to FIG. 2C, a first lining dielectric layer (60), preferably composed of silicon dioxide, is formed on the sidewalls of the contact opening (55), on the top hard mask layer (54) and on the contact area (25) of the semiconductor structure (10). The first lining dielectric layer (60) is preferably formed to a thickness of between about 100 Angstroms and 500 Angstroms using plasma enhanced chemical vapor deposition. A second lining dielectric layer (70), preferably composed of silicon nitride (Si$_3$N$_4$), is formed on the first lining dielectric layer (60). The second lining dielectric layer is preferably formed to a thickness of between about 100 Angstroms and 200 Angstroms using plasma enhanced chemical vapor deposition. A third lining dielectric layer (80), preferably composed of silicon dioxide, is formed on the second lining dielectric layer (70). The third lining dielectric layer (80) is preferably formed to a thickness of between about 100 Angstroms and 500 Angstroms using plasma enhanced chemical vapor deposition.

A key aspect of the present invention is that the poor step coverage properties of the PECVD oxide in the third lining dielectric layer (80) causes an overhang, reducing the width of the self-aligned contact opening (55) at the top of the opening. This will result in self-aligned contact opening spacers having sufficient thickness to prevent etching the second lining dielectric layer (70) during oxide etch back.

Figure 2D:
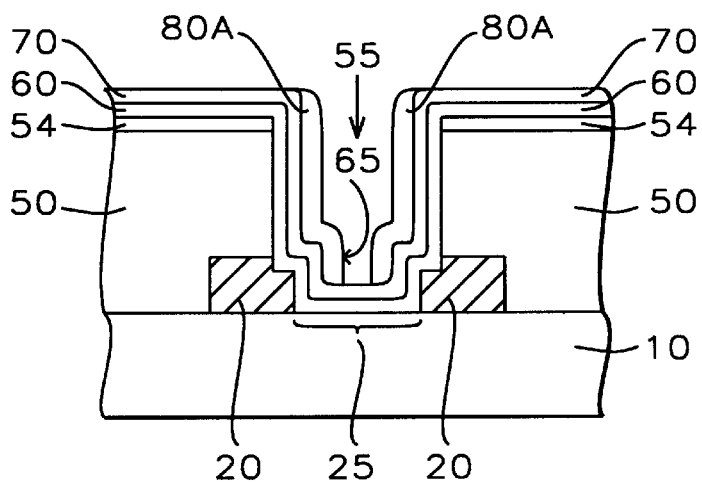

Referring to FIG. 2D, the third lining dielectric layer (80) is anisotropically etched forming a second self aligned contact opening (65) in the third lining dielectric layer (60) over the contact area (25) and forming contact opening spacers (80A) on the sidewalls of the self aligned contact opening (55), thereby exposing the second lining dielectric layer (70) over the top hard mask layer (54) and over the contact area (25). The width of the second self aligned contact opening (65) is preferably between about 0.05 microns and 0.20 microns.

Figure 2E:
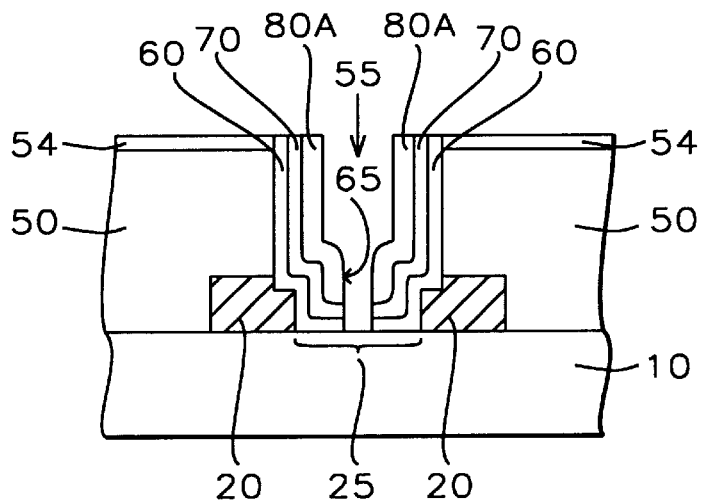

Referring to FIG. 2E, the second lining dielectric layer (70) and the first lining dielectric layer (60) are anisotropically etched over the top hard mask layer (54) and over the contact area (25), thereby exposing the top hard mask layer (54) and the contact area (25) of the semiconductor structure (10).

Figure 2F:
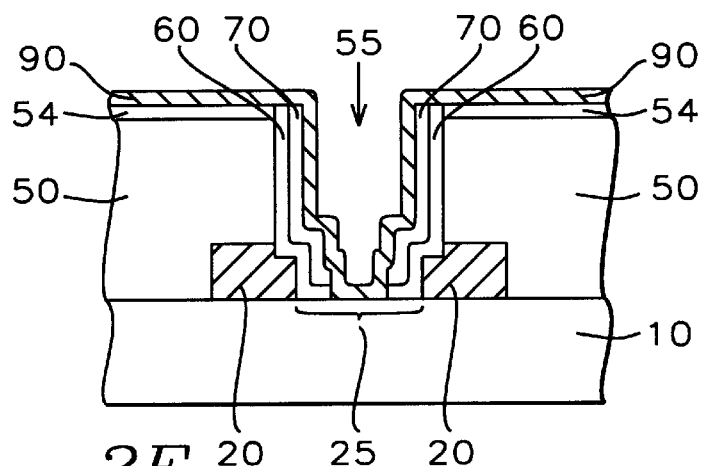

Referring to FIG. 2F, the remaining portions of the contact opening spacers (80A) are removed, preferably using a buffered HF dip. A contact layer (90), preferably composed of polysilicon, is formed on the contact area (25) of the semiconductor structure (10), the lining nitride layer (70) on the sidewalls of the contact opening (55), and on the top hard mask layer (54). The contact layer (90) preferably has a thickness of between about 1000 Angstroms and 3000 Angstroms. The contact layer (90) can act as a bit line or as a bit line contact.

Yet another advantage of the present invention is that silicon nitride etch through problem is reduced. Because the second lining dielectric layer (70) is not formed until after the contact opening (55) etch, is is not affected by that etch. During the etch of form the second contact opening (65), the second lining dielectric layer (70) is protected by the contact opening spacers (80A), thereby preventing conductive structure (20) to contact layer (90) shorting.

While the first lining dielectric layer (60) and the third lining dielectric layer (80) are preferably composed of PECVD silicon dioxide and the second lining dielectric layer (70) is preferably composed of silicon nitride, other combinations of dielectric materials are possible, including, but not limited to first and third lining dielectric layers composed of silicon nitride, and silicon lining dielectric layer composed of silicon oxide. The first lining dielectric layer (60) should have poor step coverage properties, and the there must be good etch selectivity between the third lining dielectric layer and the second lining dielectric layer and between the second lining dielectric layer and the first lining dielectric layer.

Figure 3:
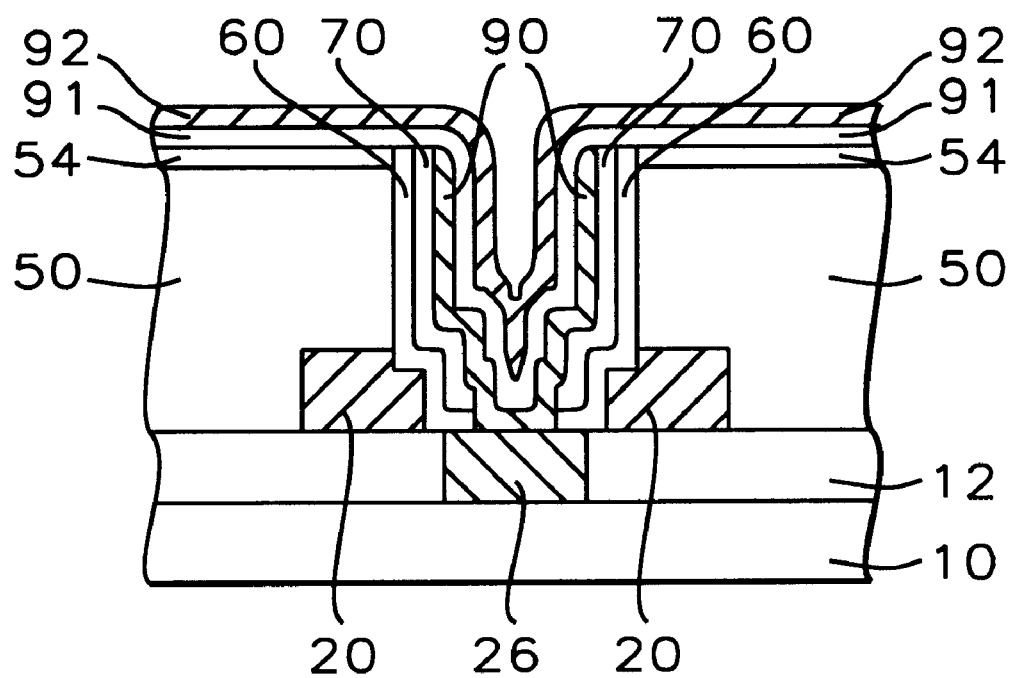
FIG. 3 illustrates a sectional view of a capacitor contact formed according to the process of the present invention.

FIG. 3 illustrates a capacitor device formed by a second preferred embodiment of the present invention. A conductive plug (26) is formed in a insulating layer (12) (e.g. IPO layer, ILD layer, IMD layer) overlying a semiconductor structure (10). Conductive structures (20) are formed over the insulating layer (12). The conductive structures (20) are preferably raised bit lines having a thickness of between about 1000 Angstroms and 3000 Angstroms and having a thickness of between about 0.15 microns and 0.30 microns. The conductive plug (26) preferably has a width of between about 0.1 microns and 0.25 microns.

The first lining dielectric layer (60), second lining dielectric layer (70), and third lining dielectric layer (not shown) are formed and etched as described above in the first preferred embodiment. The first lining dielectric layer (60) is preferably composed of silicon oxide having a thickness of between about 100 Angstroms and 500 Angstroms. The second lining dielectric layer (70) is preferably composed of silicon nitride having a thickness of between about 100 Angstroms and 200 Angstroms. The third lining dielectric layer is preferably composed of silicon oxide having a thickness of between about 100 Angstroms and 500 Angstroms. In the second embodiment, the second contact opening (not shown), etched in the second lining oxide layer has a width of between about 0.05 microns and 0.20 microns. The third lining dielectric layer is removed as as described above, and a contact layer (90) and top hard mask layer (not shown) are formed over the second lining dielectric layer (70), contact plug (26) and dielectric layer (50). The top hard mask layer is preferably comprised of silicon oxynitride having a thickness of between about 100 Angstroms and 300 Angstroms.

The contact layer (90) and the hard mask layer (not shown) are chemical mechanical polished, thereby removing the top hard mask layer. The contact layer (90) acts as the bottom electrode of a capacitor.

A capacitor dielectric layer (91) is formed on the contact layer (90). The capacitor dielectric layer (91) can be comprised of a nitogen/oxide (NO) stack, or most preferably an oxide/nitride/oxide (ONO) stack. The ONO stack can be formed using the process described above for the first lining oxide layer, lining nitride layer, and second lining oxide layer, and preferably has a thickness of between about 40 Angstroms and 80 Angstroms.

A cell plate layer (92) is formed on the capacitor dielectric layer (91), thereby completing the capacitor. The capacitor is comprised of the bottom electrode layer, the capacitor dielectric layer and the cell plate layer. The cell plate layer is preferably comprised of polysilicon and preferably has a thickness of between about 500 Angstroms and 2000 Angstroms.

What is claimed is:

1. A method for forming a self aligned contact, comprising the steps of:
   a. providing a semiconductor structure, having a conductive structure thereon and having a contact area adjacent to said conductive structure;
   b. forming a dielectric layer over said semiconductor structure and said conductive structure;
   c. forming a top hard mask layer over said dielectric layer;
   d. forming a contact opening in said top hard mask and said dielectric layer over said contact area; said contact opening opening having sidewalls;
   e. forming a first lining dielectric layer on said sidewalls of said contact opening, on said top hard mask layer and on said contact area;
   f. forming a second lining dielectric layer on said first lining dielectric layer;
   g. forming a third lining dielectric layer over said second lining dielectric layer wherein said first and third lining dielectric layer material is different than said second lining dielectric layer material;
   h. anisotropically etching said third lining dielectric layer to form a second contact opening in said third lining dielectric layer over said contact area and to form spacers over said sidewalls of said contact opening;
   i. anisotropically etching said second lining dielectric layer and said first lining dielectric layer; thereby exposing said contact area of said semiconductor structure and said top hard mask layer;
   j. removing said spacers; and
   k. forming a contact layer composed of polysilicon on said second lining dielectric layer, said top hard mask layer, and said contact area of said semiconductor structure.

2. The method of claim 1 wherein said conductive structure has a thickness of between about 1000 Angstroms and 3000 Angstroms and a width of between about 0.15 microns and 0.30 microns.

3. The method of claim 1 wherein said top hard mask layer is composed of silicon oxynitride and has a thickness of between about 100 Angstroms and 300 Angstroms.

4. The method of claim 1 wherein said first lining dielectric layer is composed of silicon dioxide having a thickness of between about 100 Angstroms and 500 Angstroms and said second lining dielectric layer is composed of silicon nitride having a thickness of between about 100 Angstroms and 200 Angstroms.

5. The method of claim 1 wherein said third lining dielectric layer is composed of silicon dioxide having a thickness of between about 100 Angstroms and 500 Angstroms and said second contact opening has a width of between about 0.05 microns and 0.20 microns.

6. The method of claim 4 wherein said third lining dielectric layer is composed of silicon dioxide having a thickness of between about 100 Angstroms and 500 Angstroms and said second contact opening has a width of between about 0.05 microns and 0.20 microns.

7. The method of claim 1 wherein said first lining dielectric layer is composed of silicon nitride, said second lining dielectric layer is composed of silicon dioxide, and said third lining dielectric layer is composed of silicon nitride.

8. A method for forming a capacitor over bit lines comprising the steps of:
   a. providing a semiconductor structure, having an overlying insulating layer with a conductive plug formed in an opening in said insulating layer; said insulating layer having a plurality of conductive structures thereover adjacent to said conductive plug;
   b. forming a dielectric layer over said semiconductor structure and said conductive structures;
   c. forming a top hard mask layer over said dielectric layer;
   d. forming a contact opening in said top hard mask layer and said dielectric layer over said conductive plug; said contact opening having sidewalls;
   e. forming a first lining dielectric layer on said sidewalls of said contact opening, on said top hard mask layer, and on said conductive plug;
   f. forming a second lining dielectric layer on said first lining dielectric layer;
   g. forming a third lining dielectric layer over said second lining dielectric layer wherein said first and third lining dielectric layer material is different than said second lining dielectric layer material;
   h. anisotropically etching said third lining dielectric layer to form a second contact opening in said third lining dielectric layer over said contact area and to form spacers over said sidewalls of said contact opening;
   i. anisotropically etching said second lining dielectric layer and said first lining dielectric layer; thereby exposing said contact area of said semiconductor structure and said top hard mask layer;
   j. removing said spacers;
   k. forming a contact layer composed of polysilicon on said second lining dielectric layer, said top hard mask layer, and said contact plug;
   l. chemical-mechanical polishing said contact layer and said top hard mask layer; thereby removing said top hard mask layer;
   m. forming a capacitor dielectric layer on said contact layer; and
   n. forming a cell plate layer on said capacitor dielectric layer and over the dielectric layer; thereby forming a capacitor.

9. The method of claim 8 wherein said conductive structure has a thickness of between about 1000 Angstroms and 3000 Angstroms and width of between about 0.15 microns and 0.30 microns.

10. The method of claim 8 wherein said top hard mask layer is composed of silicon oxynitride and has a thickness of between about 100 Angstroms and 300 Angstroms.

11. The method of claim 8 wherein said first lining dielectric layer is composed of silicon dioxide having a thickness of between about 100 Angstroms and 500 Angstroms and said second lining dielectric layer is composed of silicon nitride having a thickness of between about 100 Angstroms and 200 Angstroms.

12. The method of claim 8 wherein said third lining dielectric layer is composed of silicon dioxide having a thickness of between about 100 Angstroms and 500 Angstroms and said second contact opening has a width of between about 0.05 microns and 0.20 microns.

13. The method of claim 11 wherein said third lining dielectric layer is composed of silicon dioxide having a thickness of between about 100 Angstroms and 500 Angstroms and said second contact opening has a width of between about 0.05 microns and 0.20 microns.

14. The method of claim 13 wherein said capacitor dielectric layer has a thickness of between about 40 Angstroms and 80 Angstroms and said cell plate layer has a thickness of between about 500 Angstroms and 2000 Angstroms.

* * * * *